United States Patent
Madan et al.

(10) Patent No.: US 9,117,535 B2
(45) Date of Patent: Aug. 25, 2015

(54) SINGLE SIDED BIT LINE RESTORE FOR POWER REDUCTION

(71) Applicant: TEXAS INSTRUMENTS INCORPORATED, Dallas, TX (US)

(72) Inventors: Sudhir K. Madan, Richardson, TX (US); Hugh P. McAdams, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/063,628

(22) Filed: Oct. 25, 2013

(65) Prior Publication Data
US 2014/0247642 A1 Sep. 4, 2014

Related U.S. Application Data

(60) Provisional application No. 61/772,234, filed on Mar. 4, 2013.

(51) Int. Cl.
*G11C 8/08* (2006.01)
*G11C 11/22* (2006.01)
*G11C 17/12* (2006.01)

(52) U.S. Cl.
CPC .......... *G11C 11/2273* (2013.01); *G11C 11/221* (2013.01); *G11C 17/12* (2013.01)

(58) Field of Classification Search
CPC .................................. G11C 11/22; G11C 8/08
USPC ............................................ 365/145, 230.06
See application file for complete search history.

(56) References Cited

U.S. PATENT DOCUMENTS 6,587,385 B2 * 7/2003 Ooishi ........................... 365/191
7,473,565 B2 * 1/2009 Arisumi et al. ................... 438/3

* cited by examiner

*Primary Examiner* — Michael Tran
(74) *Attorney, Agent, or Firm* — Rose Alyssa Keagy; Frank D. Cimino (57) ABSTRACT

A memory circuit to reduce active power is disclosed (FIG. 7). The circuit includes a sense amplifier (600). A first bit line (BL) is coupled to a memory array. A second bit line (BLB) that is a complementary bit line to the first bit line is also coupled to the memory array. A first transistor (TG) is coupled between the first bit line (BL) and the sense amplifier. A second transistor (TG) is coupled between the second bit line (BLB) and the sense amplifier. A first drive circuit (700) is coupled between the sense amplifier and the first bit line and is operable to drive a first data signal from the sense amplifier onto the first bit line when the second transistor is off.

20 Claims, 8 Drawing Sheets

SINGLE SIDED BIT LINE RESTORE FOR POWER REDUCTION

CLAIM TO PRIORITY OF NONPROVISIONAL APPLICATION

This application claims the benefit under 35 U.S.C. §119 (e) of Provisional Appl. No. 61/772,234 (TI-73546PS), filed Mar. 4, 2013, which is incorporated herein by reference in its entirety.

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Each of these nonvolatile memory circuits has at least one nonvolatile memory element such as a floating gate, silicon nitride layer, programmable resistance, or other nonvolatile memory element that maintains a data state when an operating voltage is removed. Many new applications, however, require the access time and packing density of previous generation nonvolatile memories in addition to low power consumption for battery powered circuits. One nonvolatile memory technology that is particularly attractive for these low power applications is the ferroelectric memory cell, which uses a ferroelectric capacitor for a nonvolatile memory element. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. SBT has several advantages over PZT. Memories fabricated from either ferroelectric material have a destructive read operation. In other words, the act of reading a memory cell destroys the stored data so that it must be rewritten before the read operation is terminated.

Figure 1:
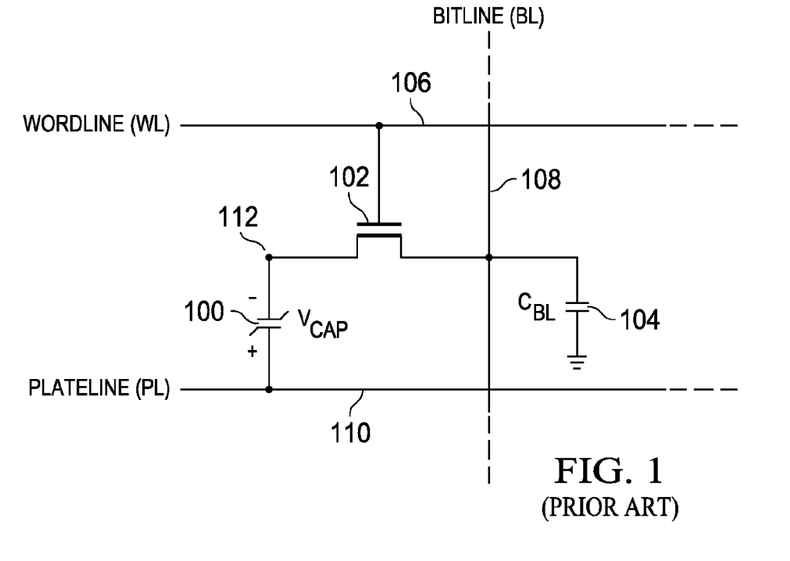
FIG. 1 is a circuit diagram of a ferroelectric memory cell of the prior art.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor 100 is connected between plate line 110 and storage node 112. Access transistor 102 has a current path connected between bit line 108 and storage node 112. A control gate of access transistor 102 is connected to word line 106 to control reading and writing of data to the ferroelectric memory cell. This data is stored as a polarized charge corresponding to cell voltage $V_{CAP}$. Capacitance of bit line BL is represented by capacitor $C_{BL}$ 104.

Figure 2:
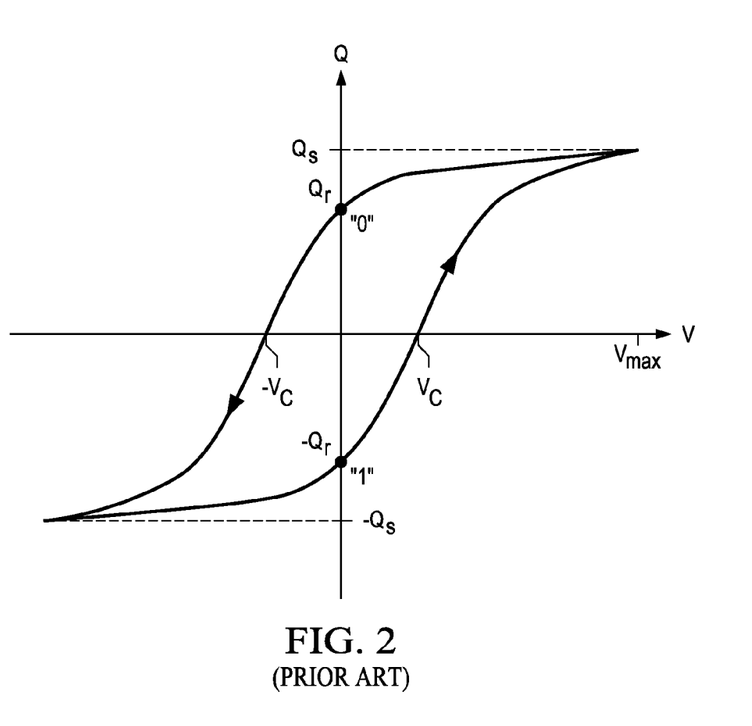
FIG. 2 is a hysteresis curve of the ferroelectric capacitor 100 of FIG. 1.

Referring to FIG. 2, there is a hysteresis curve corresponding to the ferroelectric capacitor 100. The hysteresis curve includes net charge Q or polarization along the vertical axis and applied voltage along the horizontal axis. By convention, the polarity of the ferroelectric capacitor voltage is defined as shown in FIG. 1. A stored "0", therefore, is characterized by a positive voltage at the plate line terminal with respect to the access transistor terminal. A stored "1" is characterized by a negative voltage at the plate line terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual charge Qr remains in the switching component. The stored "0" is rewritten as a "1" by applying –Vmax to the ferroelectric capacitor. This charges the linear and switching components of the ferroelectric capacitor to a saturation charge of –Qs. The stored charge reverts to –Qr when the voltage across the ferroelectric capacitor is removed. Finally, coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed. Moreover, power supply voltage across a ferroelectric capacitor must exceed these coercive voltages during a standby or sleep mode avoid data loss.

Figure 3:
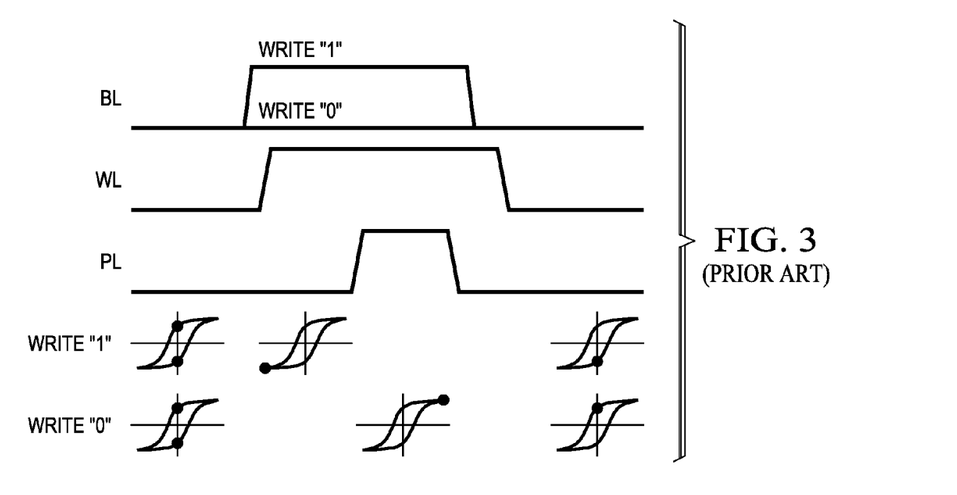
FIG. 3 is a timing diagram showing a write operation to the ferroelectric memory cell of FIG. 1.

Referring to FIG. 3, there is illustrated a typical write sequence for a ferroelectric memory cell as in FIG. 1. Initially, the bit line (BL), word line (WL), and plate line (PL) are all low. The upper row of hysteresis curves illustrates a write "1" and the lower row represents a write "0". Either a "1" or "0" is initially stored in each exemplary memory cell. The write "1" is performed when the bit line BL and word line WL are high and the plate line PL is low. This places a negative voltage across the ferroelectric capacitor and charges it to –Qs. When plate line PL goes high, the voltage across the ferroelectric capacitor is 0 V, and the stored charge reverts to –Qr. At the end of the write cycle, both bit line BL and plate line PL go low and stored charge –Qr remains on the ferroelectric capacitor. Alternatively, the write "0" occurs when bit line BL remains low and plate line PL goes high. This places a positive voltage across the ferroelectric capacitor and charges it to Qs representing a stored "0". When plate line PL goes low, the voltage across the ferroelectric capacitor is 0 V, and the stored charge reverts to Qr representing a stored "0".

Figure 4:
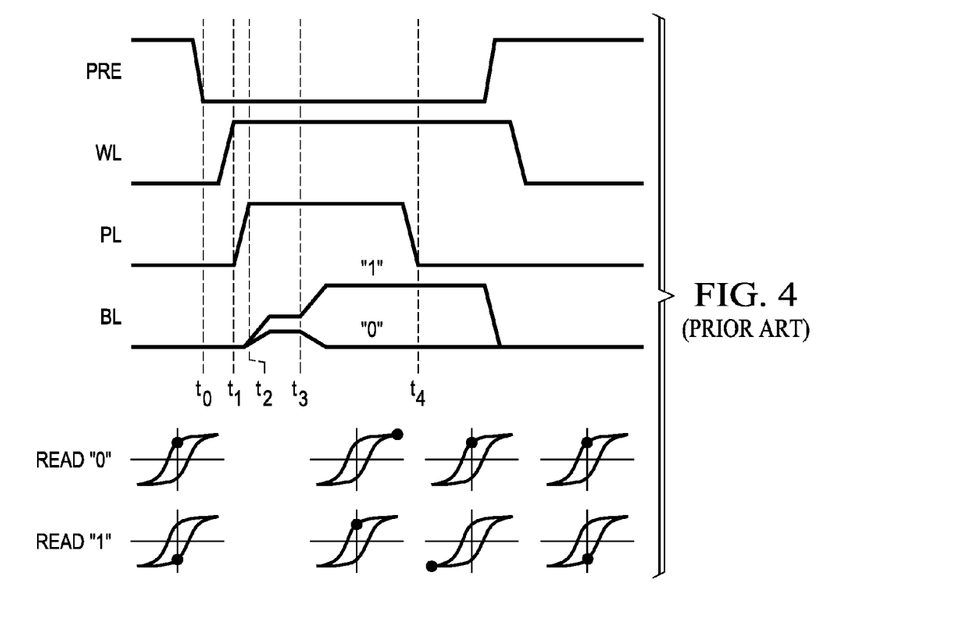
FIG. 4 is a timing diagram showing a read operation from the ferroelectric memory cell of FIG. 1.

A read operation is illustrated at FIG. 4 for the ferroelectric memory cell at FIG. 1. The upper row of hysteresis curves illustrates a read "0". The lower row of hysteresis curves illustrates a read "1". Word line WL and plate line PL are initially low. Bit lines BL are precharged low. At time $t_0$ bit line precharge signal PRE goes low, permitting the bit lines BL to float. At time $t_1$ word line WL goes high and at time $t_2$ plate line PL goes high. This permits each memory cell to share charge with a respective bit line. A stored "1" will share more charge with parasitic bit line capacitance $C_{BL}$ and produce a greater bit line voltage than the stored "0" as shown at time $t_3$. A reference voltage (not shown) is produced at each complementary bit line of an accessed bit line. This reference voltage is between the "1" and "0" voltages. Sense amplifiers are activated at time $t_3$ to amplify the difference voltage between the accessed bit line and the complementary bit line. When respective bit line voltages are fully amplified, the read "0" curve cell charge has increased from Qr to Qs. By way of comparison, the read "1" data state has changed from a stored "1" to a stored "0". Thus, the read "0" operation is nondestructive, but the read "1" operation is destructive. At time $t_4$, plate line PL goes low and applies −Vmax to the read "1" cell, thereby storing −Qs. At the same time, zero voltage is applied to the read "0" cell and charge Qr is restored. At the end of the read cycle, signal PRE goes high and precharges both bit lines BL to zero volts or ground. Thus, zero volts is applied to the read "1" cell and −Qr is restored.

Figure 5:
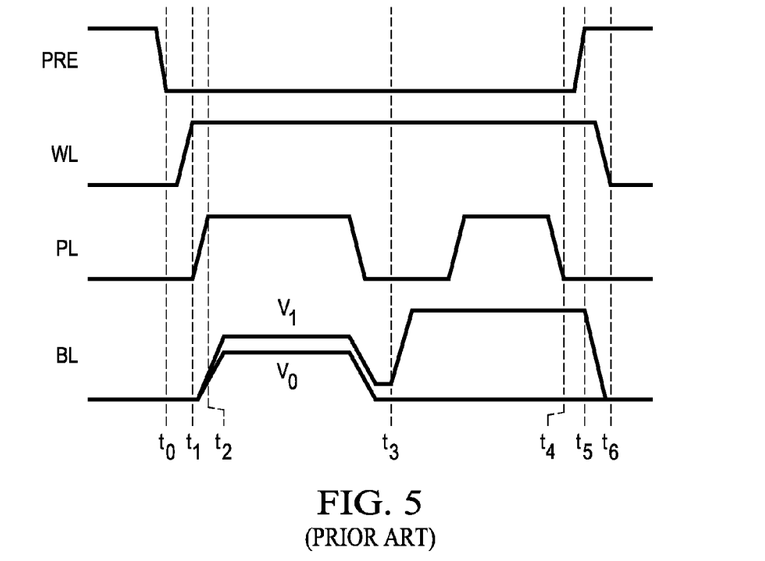
FIG. 5 is a timing diagram of a pulse sense read cycle.

Referring now to FIG. 5, a pulse sensing read operation is illustrated for a ferroelectric memory circuit. The read operation begins at time $t_0$ when precharge signal PRE goes low, permitting the bit lines BL to float. Word line WL and plate line PL are initially low, and bit lines BL are precharged low. At time $t_1$, word line WL goes high, thereby coupling a ferroelectric capacitor to a respective bit line. Then plate line PL goes high at time $t_2$, thereby permitting each memory cell to share charge with the respective bit line. The ferroelectric memory cells share charge with their respective bit lines BL and develop respective difference voltages. Here, $V_1$ represents a data "1" and $V_0$ represents a data "0". Plate line PL then goes low prior to time $t_3$, and the common mode difference voltage goes to near zero. The difference voltage available for sensing is the difference between one of $V_1$ and $V_0$ at time $t_3$ and a reference voltage (not shown) which lies approximately midway between voltages $V_1$ and $V_0$ at time $t_3$. The difference voltage is amplified at time $t_3$ by respective sense amplifiers and full bit line BL voltages are developed while the plate line PL is low. Thus, the data "1" cell is fully restored while plate line PL is low and the data "1" bit line BL is high. Subsequently, the plate line PL goes high while the data "0" bit line BL remains low. Thus, the data "0" cell is restored. The plate line PL goes low at time $t_4$, and precharge signal PRE goes high at time $t_5$. The high level of precharge signal PRE precharges the bit lines to ground or Vss. The word line WL goes low at time $t_6$, thereby isolating the ferroelectric capacitor from the bit line and completing the pulse sensing cycle.

Figure 6:
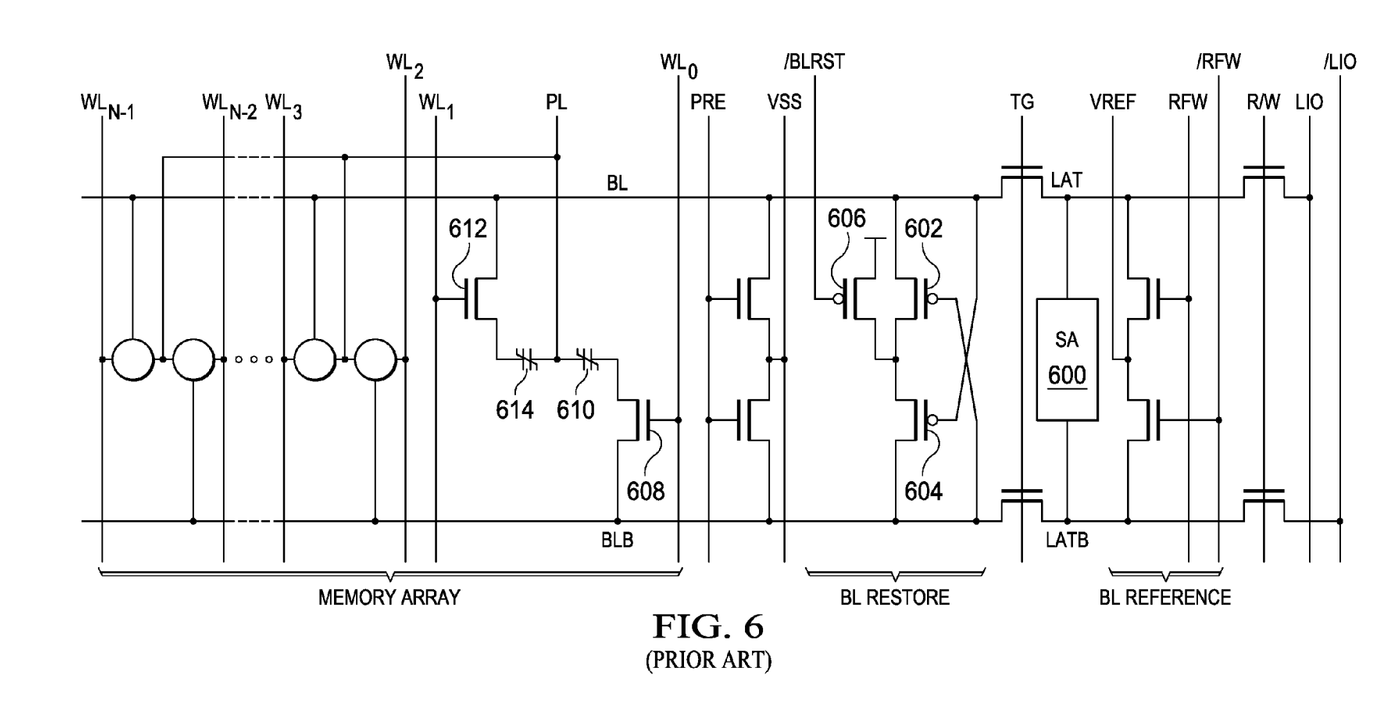
FIG. 6 is a schematic diagram of a memory circuit including a column of ferroelectric memory cells of the prior art.

Referring to FIG. 6, there is a schematic diagram of a column of ferroelectric memory cells of the prior art. A ferroelectric memory array includes plural columns of memory cells arranged in parallel. The memory array also includes plural rows of memory cells defined by N parallel word lines $WL_0$ through $WL_{N-1}$. The memory cells are arranged in pairs and coupled to adjacent word lines and complementary bit lines BL and BLB. For example, word line $WL_0$ is connected to a control terminal of access transistor 608. Access transistor 608 has a current path coupled between bit line BLB and ferroelectric capacitor 610. Ferroelectric capacitor 610 is coupled to a common plate line terminal PL. Word line $WL_1$ is connected to a control terminal of access transistor 612. Access transistor 612 has a current path coupled between bit line BL and ferroelectric capacitor 614. Ferroelectric capacitor 614 is also coupled to a common plate line terminal PL. The column further includes a bit line precharge circuit having two n-channel transistors arranged to precharge bit lines BL and BLB to VSS or ground in response to a high level of precharge signal PRE.

A bit line restore circuit includes p-channel transistors 602 through 606 and is arranged to restore either bit line BL or BLB to VDD during a read or write back operation in response to a data state. N-channel transfer gate transistors couple bit lines BL and BLB to latch lines LAT and LATB, respectively, in response to control signal TG. A bit line reference circuit is arranged to apply voltage VREF to one of bit lines BL and BLB during a read operation. For example, if a memory cell connected to bit line BL is selected, complementary bit line BLB receives reference voltage VREF. Likewise, if a memory cell connected to bit line BLB is selected, bit line BL receives reference voltage VREF. Sense amplifier 600 amplifies a difference voltage between bit lines BL and BLB during a read operation in response to control signal SAEN (not shown in FIG. 6) which enables sense amplifier 600 and applies the amplified data signal to complementary local I/O lines LIO and /LIO via n-channel read/write transistors in response to a high level of control signal R/W.

One of the problems with the memory circuit of FIG. 6 is that bit lines BL and BLB are always driven to opposite voltage supply levels during a write back operation. For example, if bit line BL is driven to 1.5 V, then complementary bit line BLB is driven to 0 V. Likewise, if complementary bit line BLB is driven to 1.5 V, then bit line BL is driven to 0 V. If there are 80 active columns, and 40 bit lines having a capacitance of 250 fF are each driven to 1.5 V, this requires 15 pC of charge transfer (40*250 fF*1.5 V) for each write back cycle. The present invention is directed to avoiding this and other disadvantages as will be discussed in detail.

BRIEF SUMMARY OF THE INVENTION

In a preferred embodiment of the present invention, a memory circuit having a sense amplifier is disclosed. A bit line and a complementary bit line are coupled to a memory array. A first transistor has a current path between the sense amplifier and the data bit line. A second transistor has a current path between the sense amplifier and the reference bit line. A first drive circuit is coupled between the sense amplifier and the data bit line and is operable to drive a first data signal from the sense amplifier onto the data bit line when the second transistor is off.

DETAILED DESCRIPTION OF THE INVENTION

Preferred embodiments of the present invention provide significant advantages in power reduction during active mode operation over memory circuits of the prior art. Active mode operation may be a read or write operation rather than a standby mode, sleep mode, or other low power mode of operation. Although a ferroelectric memory is described in a preferred embodiment, inventive concepts of the present invention may apply to other circuits as well.

Figure 7:
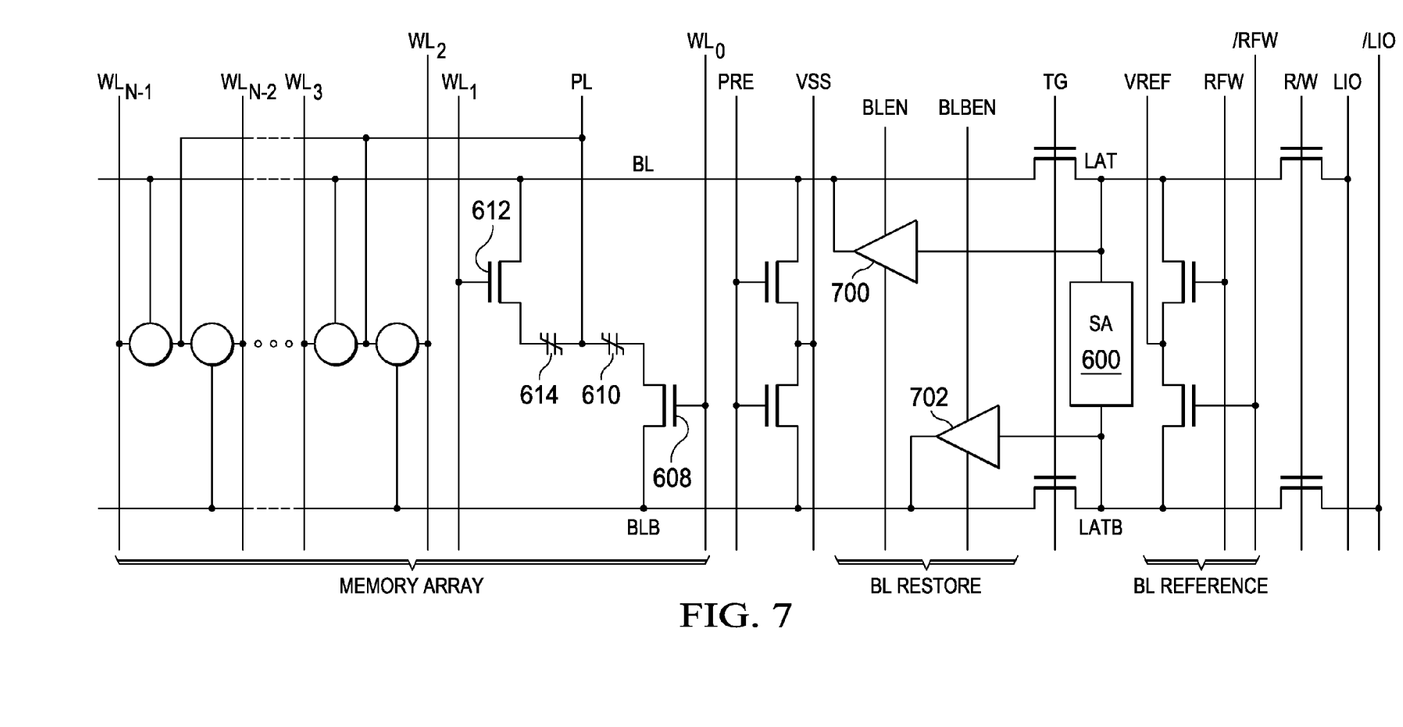
FIG. 7 is a schematic diagram of a memory circuit including a column of ferroelectric memory cells according to the present invention.

Referring to FIG. 7, there is a schematic diagram of a memory circuit of the present invention including a column of ferroelectric memory cells. The circuit is similar to the circuit of FIG. 6 except that the bit line restore circuit including p-channel transistors 602 through 606 is replaced by three-state (tri-state) drive circuits 700 and 702. Circuit 700 has an input terminal coupled to signal line LAT and an output terminal coupled to bit line BL. Circuit 702 has an input terminal coupled to signal line LATB and an output terminal coupled to complementary bit line BLB. Three-state drive circuits 700 and 702 are disabled by a low logic level of respective enable signals BLEN and BLBEN. A high level of enable signals BLEN and BLBEN, however, enables circuits 700 and 702, respectively. When disabled, circuits 700 and 702 outputs are in a high impedance state. But when enabled, circuits 700 and 702 drive their respective bit lines to the logic levels at their input terminals. Enable signals BLEN and BLBEN and control signals RFW and /RFW are selected in response to row address signals. For example, when an even word line such as $WL_0$ is addressed, a memory cell connected to complementary bit line BLB is selected. Thus, enable signal BLEN remains low and circuit 700 remains in a high impedance state. Enable signal BLBEN, however, will go high at the proper time to enable circuit 702 to write back an appropriate logic level to the selected memory cell. Correspondingly, control signals RFW and /RFW go high and low, respectively, so that reference voltage VREF is applied to bit line BL but not to complementary bit line BLB.

Figure 8:
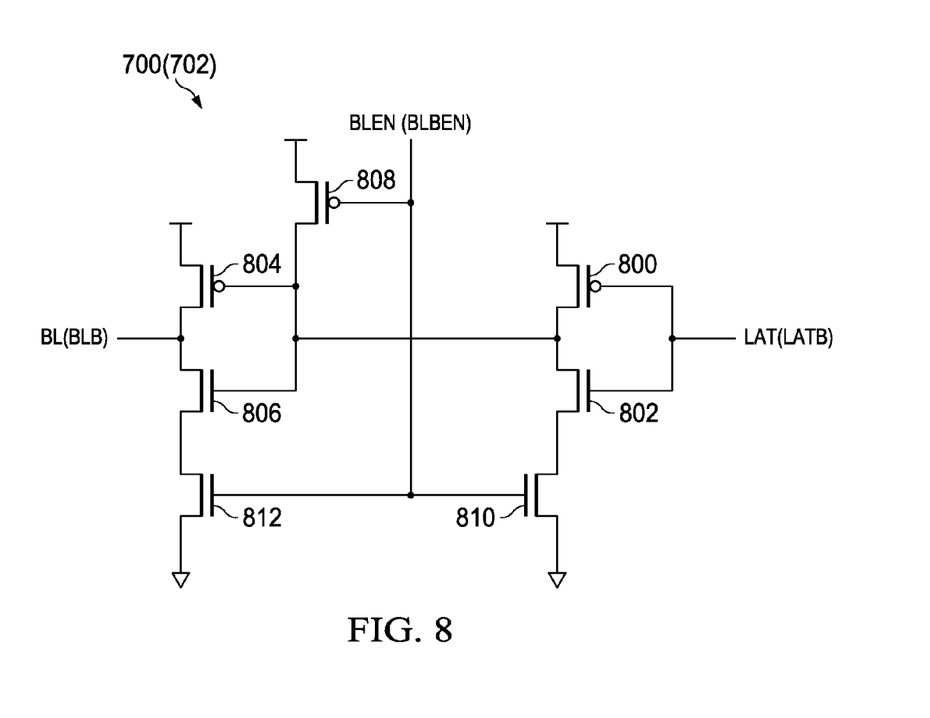
FIG. 8 is a schematic diagram of a three-state drive circuit that may be used with the a column of ferroelectric memory cells of FIG. 7.

FIG. 8 is a schematic diagram of a three-state drive circuit that may be used for three-state drive circuits 700 or 702 with the memory circuit of FIG. 7. The drive circuit includes an input inverter having p-channel transistor 800 and n-channel transistor 802. The output terminal of the input inverter is coupled to the input terminal of an output inverter having p-channel transistor 804 and n-channel transistor 806. N-channel transistor 810 disables the input inverter in response to a low level of enable signal BLEN(BLBEN) and enables the input inverter in response to a high level of enable signal BLEN(BLBEN). P-channel transistor 808 and n-channel transistor 812 disable the output inverter in response to a low level of enable signal BLEN(BLBEN) and enable the output inverter in response to a high level of enable signal BLEN(BLBEN). For example, a low level of enable signal BLEN(BLBEN) turns off n-channel transistors 810 and 812, thereby isolating the input and output inverters from power supply terminal VSS indicated by the small triangles. The low level of enable signal BLEN(BLBEN) also turns on p-channel transistor 808, which applies a high level signal to the control gate of p-channel transistor 804, thereby turning it off. In this mode, therefore, output terminal BL(BLB) is in a high impedance state.

A high level of enable signal BLEN(BLBEN) turns on n-channel transistors 810 and 812 and turns off p-channel transistor 808. In this mode, both input and output inverters are enabled and drive the signal level at input terminal LAT (LATB) onto respective output terminal BL(BLB). This advantageously provides an appropriate logic level to restore the selected ferroelectric memory cell as will become evident in the following detailed discussion.

Operation of the circuit of FIG. 7 while reading a logical "1" and writing back a logical "1" will now be explained with reference the timing diagram of FIG. 9A. In the following discussion, true signals are indicated by solid lines and complementary signals are indicated by dashed lines. At time t0 all signals are in their initial logic state. At time t1, precharge signal PRE goes low and allows bit line BL and complementary bit line BLB to float. At time t2, word line WL ($WL_1$ in FIG. 7) goes high so that a row of ferroelectric memory cells connected to the word line are connected to their respective bit lines. Complementary reference signal /RFW goes high and reference signal RFW remains low, since data is to be read and written on bit line BL. Thus, reference voltage VREF is isolated from LAT but applied to LATB. The high level of complementary reference signal /RFW couples approximately 0.1 V (VREF) to signal line LATB and complementary bit line BLB. At time t3, plate line PL goes high and the selected memory cell produces 0.4 V on bit line BL and a difference voltage of 0.3 V between bit lines BL and BLB and between signal lines LAT and LATB. At time t4, plate line PL returns low and leaves 0.2 V on bit line BL and a difference voltage of 0.1 V between bit lines BL and BLB and between signal lines LAT and LATB. At time t5, complementary reference signal /RFW goes low, so that LATB and BLB are floating. Transfer gate signal TG also goes low to isolate sense amplifier 600 from bit lines BL and BLB, thereby improving the sense amplifier switching speed. In some circuits, the high-to-low transition of transfer gate signal TG may be delayed until after the sense amplifier 600 has been enabled to improve sense amplifier sensitivity. At time t6, sense amplifier enable signal SAEN (FIG. 9A) goes high to activate sense amplifier 600. Sense amplifier 600 responsively amplifies the difference voltage between LAT and LATB from 0.1 V to 1.5 V (VDD). At time t7, read/write signal R/W goes high to apply the amplified difference voltage between LAT and LATB to LIO and /LIO, respectively. At time t8, read/write signal R/W goes low to isolate signal lines LIO and /LIO from LAT and LATB and complete the logical "1" read operation.

At time t8, precharge signal PRE goes high to precharge bit lines BL and BLB to 0 V. Plate line signal PL also goes high and temporarily writes a logical "0" to the ferroelectric memory cell. At time t9, read/write signal R/W goes high to transfer the write back data on signal lines LIO and /LIO to LAT and LATB. There is no change in the logical "1" data state on signal lines LAT and LATB, since LIO and /LIO also have a logical "1" data state. Bit lines BL and BLB remain isolated and precharged to 0 V, since transfer gate signal TG is low. At time t10, read/write signal R/W and plate line PL return low. At time t11, precharge signal PRE goes low, thereby floating bit lines BL and BLB. At time t12, enable signal BLEN goes high. Enable signal BLBEN remains low, since data is read and written on bit line BL. Thus, circuit 700 drives the high level of LAT onto bit line BL. Circuit 702 remains in a high impedance state, and complementary bit line BLB floats near 0 V level. The high level of bit line BL together with the low level of plate line PL writes back a logical "1" into the ferroelectric memory cell. At time t13 the logical "1" write back is complete. Sense amplifier enable signal SAEN goes low to turn off sense amplifier 600. Enable signal BLEN returns low. Transfer gate signal TG goes high to equalize LAT with BL and LATB with BLB. Precharge signal PRE goes high to precharge BL, BLB, LAT, and LATB to 0 V and to precharge LIO and /LIO to VDD. Word line WL goes low at time t14 to complete the write back cycle.

Operation of the circuit of FIG. 7 while reading a logical "0" and writing back a logical "0" will now be explained with reference the timing diagram of FIG. 9B. At time t0 all signals are in their initial logic state. At time t1, precharge signal PRE goes low and allows bit line BL and complementary bit line BLB to float. At time t2, word line WL (WL$_1$ in FIG. 7) goes high so that a row of ferroelectric memory cells connected to the word line are connected to their respective bit lines. Complementary reference signal /RFW goes high and reference signal RFW remains low, since data is to be read and written on bit line BL. Thus, reference voltage VREF is isolated from LAT but applied to LATB. The high level of complementary reference signal /RFW couples approximately 0.1 V (VREF) to signal line LATB and complementary bit line BLB. At time t3, plate line PL goes high and the selected memory cell produces 0.2 V on bit line BL and a difference voltage of 0.1 V between bit lines BL and BLB and between signal lines LAT and LATB. At time t4, plate line PL returns low and couples bit line BL to about 0 V, leaving a –0.1 V difference voltage between bit lines BL and BLB and between signal lines LAT and LATB. At time t5, complementary reference signal /RFW goes low, so that LATB and BLB are floating. Transfer gate signal TG also goes low to isolate sense amplifier 600 from bit lines BL and BLB, thereby improving the sense amplifier switching speed. At time t6, sense amplifier enable signal SAEN (FIG. 9B) goes high to activate sense amplifier 600. Sense amplifier 600 then amplifies the difference voltage between LAT and LATB from –0.1 V to –1.5 V. At time t7, read/write signal R/W goes high to apply the amplified difference voltage between LAT and LATB to LIO and /LIO, respectively. At time t8, read/write signal R/W goes low to isolate signal lines LIO and /LIO from LAT and LATB and complete the logical "0" read operation.

At time t8, precharge signal PRE goes high to precharge bit lines BL and BLB to 0 V. Plate line signal PL also goes high and writes a logical "0" to the ferroelectric memory cell. At time t9, read/write signal R/W goes high to transfer the data on signal lines LIO and /LIO to LAT and LATB. There is no change in the logical "0" data state on signal lines LAT and LATB, since LIO and /LIO also have a logical "0" data state. Bit lines BL and BLB remain isolated and precharged to 0 V, since transfer gate signal TG is low. At time t10, read/write signal R/W and plate line PL return low. At time t11, precharge signal PRE goes low, thereby floating bit lines BL and BLB. At time t12, enable signal BLEN goes high. Enable signal BLBEN remains low, since data is read and written on bit line BL. Circuit 700 drives bit line BL low in response to the low level of LAT. There is no change to complementary bit line BLB, since it is floating near 0 V. Both bit lines BL and BLB, therefore, remain at the 0 V precharge level, and no power is required for the logical "0" write back. The low level of bit line BL together with the low level of plate line PL does not change the previously written logical "0" in the ferroelectric memory cell. At time t13 the logical write back is complete. Sense amplifier enable signal SAEN goes low to turn off sense amplifier 600. Enable signal BLEN returns low. Transfer gate signal TG goes high to equalize LAT with BL and LATB with BLB. Precharge signal PRE goes high to precharge BL, BLB, LAT, and LATB to 0 V and to precharge LIO and /LIO to VDD. Word line WL goes low at time t14 to complete the write back cycle.

Figure 9A:
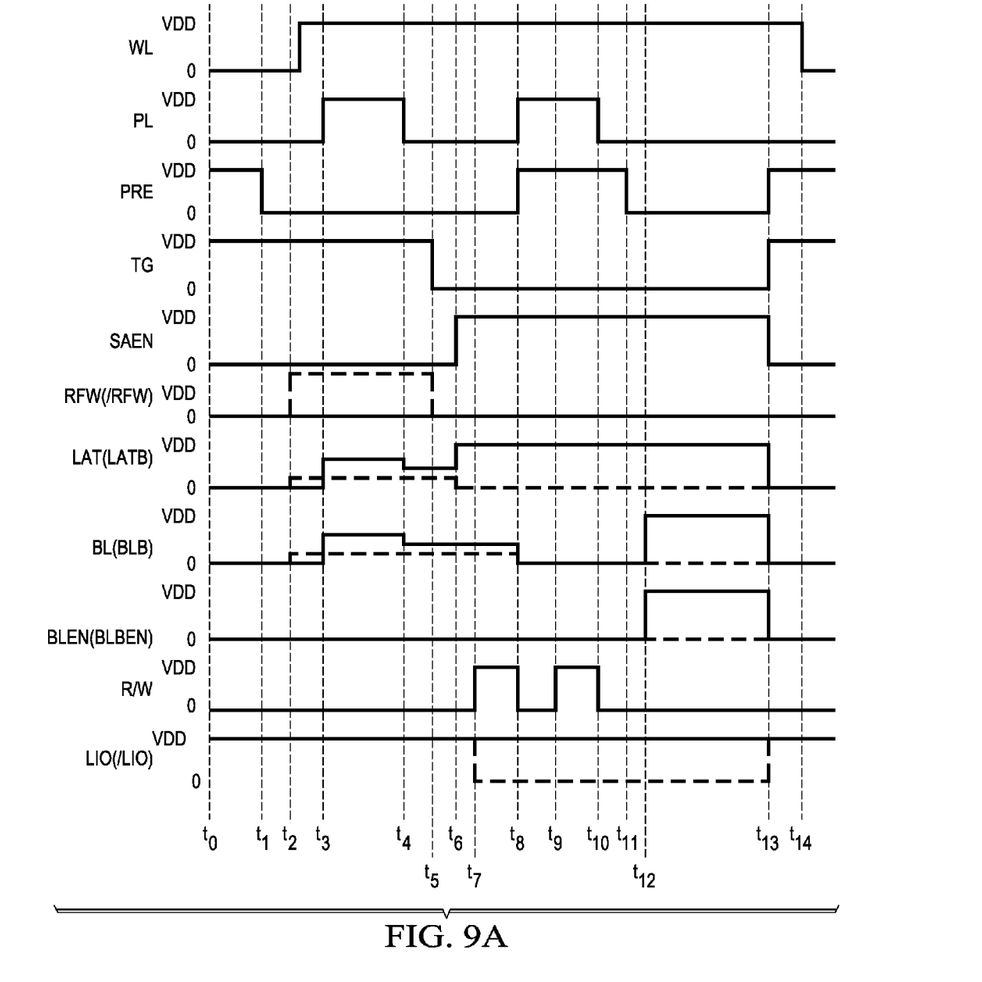
FIG. 9A is a timing diagram showing operation of the circuit of FIG. 7 while reading a logical "1" and writing back a logical "1"
Figure 9B:
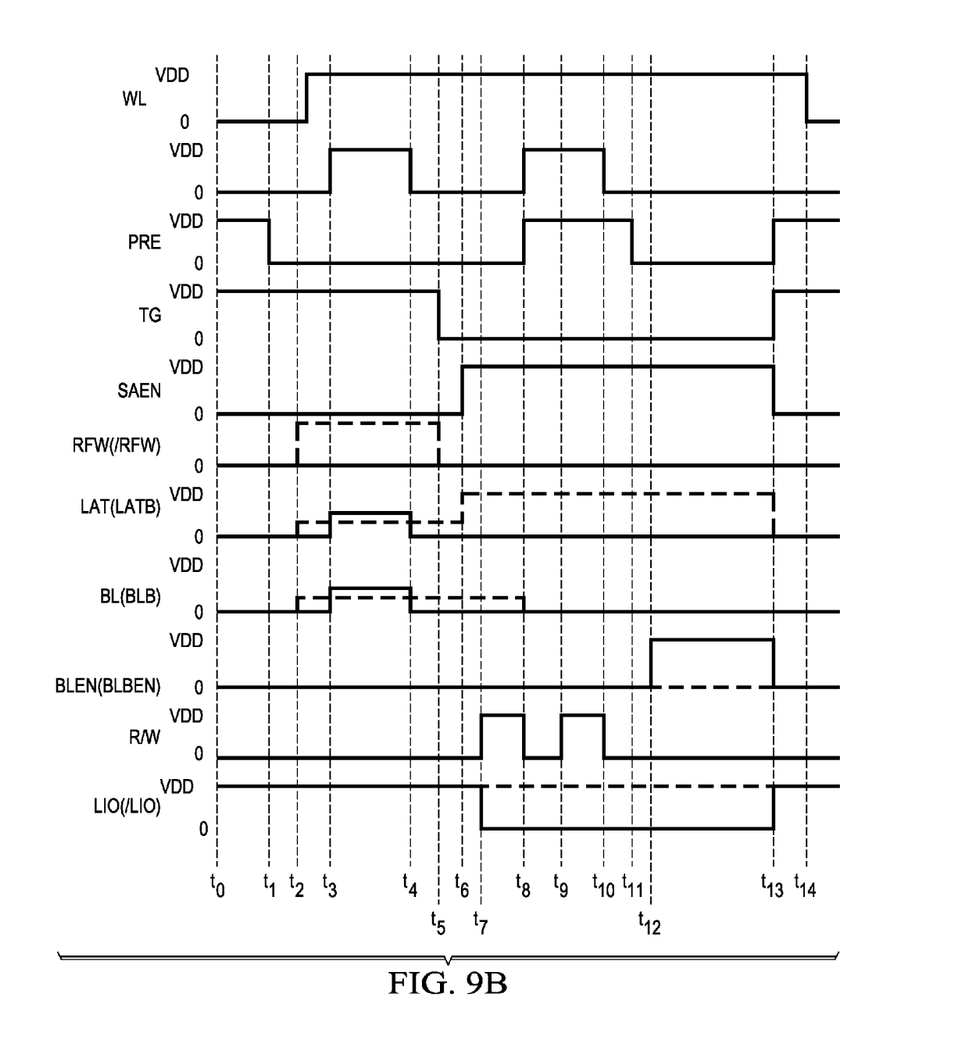
FIG. 9B is a timing diagram showing operation of the circuit of FIG. 7 while reading a logical "0" and writing back a logical "0"

A comparison of the logical "1" write back of FIG. 9A with the logical "0" write back of FIG. 9B shows that no additional power is required for the logical "0" write back. By way of comparison, memory circuits of the prior art always drive one bit line to VDD and another bit line to VSS. According to the present invention, both bit lines BL and BLB advantageously remain at 0 V during a true "0" write back. A logical "1" or true "0" write back to a memory cell on complementary bit line BLB offers the same advantage. Here, a true data state indicates the actual data state of the memory cell. The logical data state, however, depends on whether the memory cell is on bit line BL or complementary bit line BLB. In both cases it is only necessary to drive a bit line to VDD if a true "1" is written to that cell. This greatly reduces active power of the write back operation by about 6%, since the bit line that is not accessed remains at 0 V.

Figure 10:
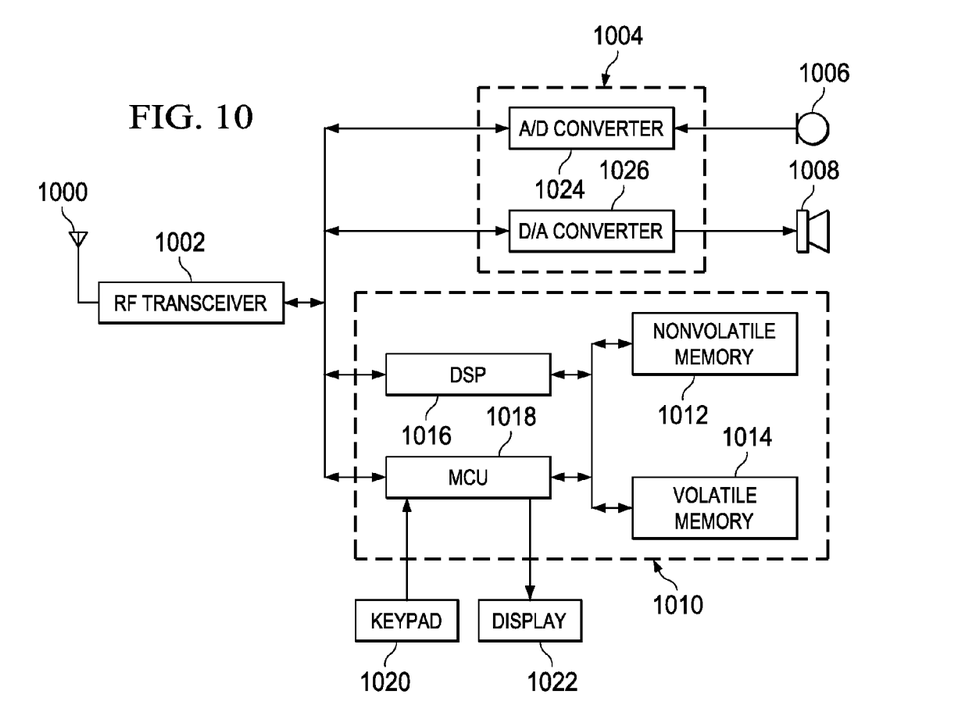
FIG. 10 is a block diagram of a wireless telephone as an example of a portable electronic device which could advantageously employ the present invention.

Referring to FIG. 10, there is a block diagram of a wireless telephone as an example of a portable electronic device which could advantageously employ this invention in a nonvolatile memory array. The wireless telephone includes antenna 1000, radio frequency transceiver 1002, base band circuits 1010, microphone 1006, speaker 1008, keypad 1020, and display 1022. The wireless telephone is preferably powered by a rechargeable battery (not shown) as is well known in the art. Antenna 1000 permits the wireless telephone to interact with the radio frequency environment for wireless telephony in a manner known in the art. Radio frequency transceiver 1002 both transmits and receives radio frequency signals via antenna 1000. The transmitted signals are modulated by the voice/data output signals received from base band circuits 1010. The received signals are demodulated and supplied to base band circuits 1010 as voice/data input signals. An analog section 1004 includes an analog to digital converter 1024 connected to microphone 1006 to receive analog voice signals. The analog to digital converter 1024 converts these analog voice signals to digital data and applies them to digital signal processor 1016. Analog section 1004 also includes a digital to analog converter 1026 connected to speaker 1008. Speaker 1008 provides the voice output to the user. Digital section 1010 is embodied in one or more integrated circuits and includes a microcontroller unit 1018, a digital signal processor 1016, nonvolatile memory circuit 1012, and volatile memory circuit 1014. Nonvolatile memory circuit 1012 may include read only memory (ROM), ferroelectric memory (FeRAM or FRAM), FLASH memory, or other nonvolatile memory as known in the art. Volatile memory circuit 1014 may include dynamic random access memory (DRAM), static random access memory (SRAM), or other volatile memory circuits as known in the art. Microcontroller unit 1018 interacts with keypad 1020 to receive telephone number inputs and control inputs from the user. Microcontroller unit 1018 supplies the drive function to display 1022 to display numbers dialed, the current state of the telephone such as battery life remaining, and received alphanumeric messages. Digital signal processor 1016 provides real time signal processing for transmit encoding, receive decoding, error detection and correction, echo cancellation, voice band filtering, etc. Both microcontroller unit 1018 and digital signal processor 1016 interface with nonvolatile memory circuit 1012 for program instructions and user profile data. Microcontroller unit 1018 and digital signal processor 1016 also interface with volatile memory circuit 1014 for signal processing, voice recognition processing, and other applications.

Still further, while numerous examples have thus been provided, one skilled in the art should recognize that various modifications, substitutions, or alterations may be made to the described embodiments while still falling with the inventive scope as defined by the following claims. For example, if bit line capacitance and circuit operating speed permit, drive circuits 700 and 702 (FIG. 7) may be n-channel or p-channel transistors having current paths between the sense amplifier and their respective bit lines. The present invention may also be applied to dynamic random access memory (DRAM) circuits. Furthermore, the present invention may also be used with three-transistor, one-capacitor (3T1C) of four-transistor, one-capacitor (4T1C) ferroelectric memory cells. Moreover, advantages of the present invention also apply to other types of circuits that would benefit from reduced power consumption in active modes of operation. Other combinations will be readily apparent to one of ordinary skill in the art having access to the instant specification.

What is claimed is:

1. A memory circuit, comprising:
a sense amplifier;
a first bit line coupled to a memory array;
a second bit line coupled to the memory array, wherein the second bit line is arranged as a complementary bit line to the first bit line;
a second transistor having a current path between the sense amplifier and the second bit line; and
a first drive circuit coupled between the sense amplifier and the first bit line and operable to drive a first data signal from the sense amplifier onto the first bit line when the second transistor is off.

2. A memory circuit as in claim 1, wherein the first drive circuit is a transistor having a current path between the sense amplifier and the first bit line.

3. A memory circuit as in claim 1, wherein the first drive circuit is selected in response to a first row address signal.

4. A memory circuit as in claim 1, wherein the first drive circuit is a three-state drive circuit.

5. A memory circuit as in claim 1, wherein the memory array comprises ferroelectric memory cells.

6. A memory circuit as in claim 1, wherein the memory array comprises one-transistor, one-capacitor (1T1C) memory cells.

7. A memory circuit as in claim 1, comprising a first transistor having a current path between the sense amplifier and the first bit line.

8. A memory circuit as in claim 7, wherein the first drive circuit is operable to drive the first data signal from the sense amplifier onto the first bit line when the first transistor is off.

9. A method of operating a memory circuit, comprising:
applying a signal voltage from a memory cell to a first bit line;
applying a reference voltage to a second bit line;
coupling the first and second bit lines to a sense amplifier;
amplifying a difference voltage between the signal voltage and the reference voltage to produce an output voltage by the sense amplifier; and
isolating the second bit line from the sense amplifier while applying the output voltage to the first bit line.

10. A method as in claim 9, comprising isolating the sense amplifier by forming a high impedance path between the sense amplifier and the second bit line.

11. A method as in claim 9, comprising isolating the second bit line and applying a predetermined voltage to the second bit line.

12. A method as in claim 11, wherein the predetermined voltage is 0 V.

13. A method as in claim 9, wherein the memory cell is one of a ferroelectric memory cell and a dynamic random access memory cell.

14. A method as in claim 9, wherein the memory cell is one of a one-transistor, one-capacitor (1T1C) memory cell, three-transistor, one-capacitor (3T1C) memory cell, and a four-transistor, one-capacitor (4T1C) memory cell.

15. A method as in claim 9, comprising isolating the second bit line and floating the second bit line.

16. A method as in claim 9, comprising applying the output voltage to the first bit line with a three-state drive circuit.

17. A computer system, comprising:
a processor circuit;
an input device coupled to the processor circuit;
an output device coupled to the processor circuit; and
a memory circuit comprising:
a sense amplifier;
a first bit line coupled to a memory array;
a second bit line coupled to the memory array, wherein the second bit line is arranged as a complementary bit line to the first bit line;
a second transistor having a current path between the sense amplifier and the second bit line; and
a first drive circuit coupled between the sense amplifier and the first bit line and operable to drive a first data signal from the sense amplifier onto the first bit line when the second transistor is off.

18. A computer system as in claim 17, wherein the first drive circuit is a transistor having a current path between the sense amplifier and the first bit line.

19. A computer system as in claim 17, wherein the first drive circuit is operable to drive the first data signal from the sense amplifier onto the first bit line when the first transistor is off.

20. A computer system as in claim 17, comprising a first transistor having a current path between the sense amplifier and the first bit line.

* * * * *